(12) United States Patent
Sayyah et al.

(10) Patent No.: US 9,800,018 B2
(45) Date of Patent: Oct. 24, 2017

(54) CHIP-SCALE POWER SCALABLE ULTRAVIOLET OPTICAL SOURCE

(71) Applicant: HRL LABORATORIES, LLC, Malibu, CA (US)

(72) Inventors: Keyvan Sayyah, Santa Monica, CA (US); Oleg M. Efimov, Thousand Oaks, CA (US); Pamela R. Patterson, Los Angeles, CA (US); Andrey A. Kiselev, Malibu, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/048,440

(22) Filed: Feb. 19, 2016

(65) Prior Publication Data

US 2016/0248225 A1    Aug. 25, 2016

Related U.S. Application Data

(60) Provisional application No. 62/118,676, filed on Feb. 20, 2015.

(51) Int. Cl.
*H01S 5/06*     (2006.01)
*H01S 5/022*    (2006.01)
(Continued)

(52) U.S. Cl.
CPC .......... *H01S 5/0604* (2013.01); *H01S 3/2383* (2013.01); *H01S 5/0092* (2013.01);
(Continued)

(58) Field of Classification Search
CPC .... H01S 5/0604; H01S 5/1014; H01S 5/0264; H01S 5/4025; H01S 5/22; H01S 5/34333;
(Continued)

(56) References Cited

U.S. PATENT DOCUMENTS 5,003,550 A    3/1991  Welch et al.
5,742,045 A    4/1998  Parker et al.
(Continued)

OTHER PUBLICATIONS

International Search Report and Written Opinion mailed on May 27, 2016 for PCT/US2016/018808.
(Continued)

*Primary Examiner* — Dung Nguyen
(74) *Attorney, Agent, or Firm* — Ladas & Parry (57) ABSTRACT

A chip scale ultra violet laser source includes a plurality of laser elements on a substrate each including a back cavity mirror, a tapered gain medium, an outcoupler, a nonlinear crystal coupled to the outcoupler with a front facet that has a first coating that is anti-reflectivity (AR) to a fundamental wavelength of the laser element and high reflectivity (HR) to ultra violet wavelengths, and has an exit facet that has a second coating that has HR to a fundamental wavelength of the laser element and AR to the ultra violet wavelengths, a photodetector coupled to the outcoupler, a phase modulator coupled to the photodetector and coupled to the back cavity mirror, and a master laser diode on the substrate coupled to the phase modulator of each laser element. Each laser element emits an ultra violet beamlet and is frequency and phase locked to the master laser diode.

43 Claims, 8 Drawing Sheets (51) Int. Cl.
| | |
|---|---|
| H01S 5/024 | (2006.01) |
| H01S 5/028 | (2006.01) |
| H01S 5/042 | (2006.01) |
| H01S 5/0683 | (2006.01) |
| H01S 5/10 | (2006.01) |
| H01S 5/125 | (2006.01) |
| H01S 5/343 | (2006.01) |
| H01S 5/40 | (2006.01) |
| H01S 3/23 | (2006.01) |
| H01S 5/00 | (2006.01) |
| H01S 5/068 | (2006.01) |
| H01S 5/50 | (2006.01) |
| H01S 5/026 | (2006.01) |
| H01S 5/22 | (2006.01) |
| H01S 5/187 | (2006.01) |
| H01S 5/20 | (2006.01) |

(52) U.S. Cl.
CPC ............ *H01S 5/028* (2013.01); *H01S 5/0228* (2013.01); *H01S 5/02453* (2013.01); *H01S 5/0425* (2013.01); *H01S 5/0683* (2013.01); *H01S 5/06821* (2013.01); *H01S 5/1014* (2013.01); *H01S 5/1028* (2013.01); *H01S 5/1064* (2013.01); *H01S 5/125* (2013.01); *H01S 5/34333* (2013.01); *H01S 5/4025* (2013.01); *H01S 5/4031* (2013.01); *H01S 5/50* (2013.01); *H01S 5/0261* (2013.01); *H01S 5/0264* (2013.01); *H01S 5/0287* (2013.01); *H01S 5/187* (2013.01); *H01S 5/2013* (2013.01); *H01S 5/22* (2013.01); *H01S 2301/166* (2013.01)

(58) Field of Classification Search
CPC ...... H01S 5/0683; H01S 5/125; H01S 5/1028; H01S 5/02453; H01S 5/028; H01S 5/0425
See application file for complete search history.

(56) References Cited

U.S. PATENT DOCUMENTS

| | | | | |
|---|---|---|---|---|
| 9,065,243 | B2* | 6/2015 | Asobe | G02F 1/39 |
| 2003/0202794 | A1* | 10/2003 | Izadpanah | H01Q 3/2676 |
| | | | | 398/115 |
| 2004/0070385 | A1* | 4/2004 | Meschenmoser | G01S 7/35 |
| | | | | 324/76.19 |
| 2005/0084202 | A1* | 4/2005 | Smith | B82Y 20/00 |
| | | | | 385/14 |
| 2006/0140237 | A1 | 6/2006 | Amarasinghe et al. | |
| 2009/0141753 | A1* | 6/2009 | Furuya | G09G 3/002 |
| | | | | 372/26 |
| 2009/0227056 | A1* | 9/2009 | Kyono | B82Y 20/00 |
| | | | | 438/33 |
| 2012/0057610 | A1 | 3/2012 | Dallesasse et al. | |
| 2014/0169800 | A1 | 6/2014 | Eid et al. | |

OTHER PUBLICATIONS

Smith, Richard G. "Theory of Intracavity Optical Second-Harmonic Generation." *IEEE Journal of Quantum Electronics* vol. QE-6, No. 4 (Apr. 1970): 215-223.

Fallahi, Mahmoud et al. "5-W Yellow Laser by Intracavity Frequency Doubling of High-Power Vertical-External-Cavity Surface-Emitting Laser." *IEEE Photonics Technology Letters* vol. 20 No. 20 (Oct. 15, 2008): 1700-1702.

Raring, James W. et al. "High-Efficiency Blue and True-Green Emitting Laser Diodes Based on Non-c-Plane Oriented GaN Substrates." *Applied Physics Express* vol. 3 Issue. 11 (2010): 112101-1-11201-3.

Selmic, S.R. et al. "Single Frequency 1550-nm AlGaINAs-InP Tapered High-Power Laser With a Distributed Bragg Reflector" *IEEE Photonics Technology Letters* vol. 14 No. 7 (Jul. 2002): 890-892.

Agnarsson, Bjorn et al. "On-chip modulation of evanescecent illumination and live-cell imaging with polymer waveguides" *Optics Express* vol. 19 No. 23 (Oct. 27, 2011): 22929-22935.

Kuwabara, Masakazu et al. "Laser Operation of Nitride Laser Diodes with GaN Well Layer in 340 nm Band" *Japanese Journal of Applied Physics* vol. 52 (May 31, 2013): 08JG10-1-08JG10-4.

Deyra, Loic et al. "Deep-UV 236.5 nm laser by fourth-harmonic generation of a single-crystal fiber Nd:YAG oscillator" *Optics Letters* vol. 39 No. 8 (Apr. 15, 2015): 2236-2239.

Richter, A. et al. "Continuous-wave ultraviolet generation at 320 nm by intracavity frequency doubling of red-emitting Praseodymium lasers" *Optics Express* vol. 14 No. 8 (Apr. 3, 2006): 3282-3287.

Sun, Hong-Bo et al. "Laser-induced damage threshold and laser processing of GaN" *Proceedings of SPIE* vol. 3885 (2000): 311-322.

Ghosh et al. "Electronic band structure of wurtzite GaN under biaxial strain in the M plane investigated with photoreflectance spectroscopy" *Physical Review B* vol. 65 (2002) 075202-1-075202-7.

Feezell et al. "AlGaN-Cladding-Free Nonpolar InGaN/GaN Laser Diodes" *Japanese Journal of Applied Physics* vol. 46 No. 13 (2007) L284-L286.

Eriksson et al. "Highly Directional Grating Outcouplers with Tailorable Radiation Characteristics" *IEE Journal of Quantum Electronics* vol. 32 No. 6 (Jun. 1996) 1038-1047.

Yariv, "Photonics: Optical electronics in modern communications," 2007, New York: Oxford University Press. https://searchworks.stanford.edu/view/6306974.

Epler, "Dependence of Central-Lobe Output Power on Fill Factor of an In-Phase Laser Array" *Electronics Letters* vol. 23 No. 14 (Jul. 2, 1987) 754-755.

Farrell et al. "AlGaN-Cladding-Free m-Plane InGaN/GaN Laser Diodes with p-Type AlGaN Etch Stop Layers" *Applied Physics Express* vol. 4 (2011) 092105-1-092105-3.

* cited by examiner

FIG. 5A  Grow blue laser epi layers on m-plane GaN substrate

FIG. 5B  Pattern and etch DBR lasers, tapered lasers, and pin diode

FIG. 5C  Deposit oxide, planarize, pattern and open areas for epi re-growth

FIG. 5D Epi Re-growth of low loss core and grating layer with etch stop

FIG. 5E e-beam pattern and etch gratings stopping on AlGaN layer

FIG. 5F Remove oxide, pattern and lift off gold upper electrodes, wiring

FIG. 5G Spin on polymers, pattern WGs and grating (not shown)

FIG. 5H Pattern and lift-off Ni/Cr heater for polymer modulator

FIG. 5I Thin substrate and deposit backside gold electrode

FIG. 6

CHIP-SCALE POWER SCALABLE ULTRAVIOLET OPTICAL SOURCE

CROSS REFERENCE TO RELATED APPLICATIONS

This application is related to and claims the benefit of U.S. Provisional Patent Application Ser. No. 62/118,676, filed Feb. 20, 2015, which is incorporated herein as though set forth in full.

STATEMENT REGARDING FEDERAL FUNDING

None

TECHNICAL FIELD

This disclosure relates to ultra violet (UV) lasers, and in particular chip-scale UV lasers.

BACKGROUND

Prior art chip-scale ultra-violet lasers include diode pumped solid-state lasers, gas lasers, and fiber lasers. While chip-scale refers to the size of the devices, these prior art chip-scale ultra-violet lasers are relatively bulky in nature, and have low wall-plug efficiencies (WPEs) of less than 2%. Ultra violet lasing structures based on second harmonic generation (SHG) outside the cavity have been demonstrated. However, the demonstrated output power levels are extremely low (<1 µW) due to the inefficiency of the extra-cavity frequency doubling approach used, and the free-space implementation results in a lack of robustness for practical applications.

The shortest UV wavelength laser diode that has been demonstrated in the prior art has a wavelength of 336 nm, and is based on an $Al_{0.06}Ga_{0.94}N/Al_{0.16}Ga_{0.84}N$ multiple quantum well (MQW) structure grown on a sapphire substrate. The WPE of this laser diode is an extremely low 0.014%, with an output power of about 3 mW in the pulse mode. The main reason for the poor performance of these laser diodes is the poor AlGaN material quality, which is in particular poor as the Al mole fraction is increased for shorter emission wavelengths. As an example, an AlGaN/GaN MQW laser diode emitting at 345 nm, again grown on a sapphire substrate, had a slightly improved WPE of about 0.077%, and a peak pulsed power of 35 mV as described in Reference 6 below, which is incorporated herein by reference.

Other research in this area includes optically pumped $Al_xGa_{1-x}N$ heterostructure lasers grown on AlN substrates with emissions at 248 nm using a KrF excimer laser as a pump source. A threshold optical power density of 40 kW/cm$^2$ has been demonstrated with this laser structure. The disadvantage of this approach is that the UV laser is optically rather than electrically pumped, making it less suitable for system insertions.

Frequency multiplication has also been used to achieve lasing in the UV band. For example, an average output power of 600 mW has been demonstrated using a two-stage extra-cavity frequency doubling of a Nd:YAG fiber laser emitting at 946 nm. The first stage (946-to-473 nm) using a BiBO (Bismuth Borate, BiB3O6) crystal had a conversion efficiency of 38%, while the second stage (473-236.5 nm) using a BBO (beta barium borate) crystal had a 17% conversion efficiency as described by Reference 7 below, which is incorporated herein by reference. Also, frequency quadrupling of a Ti-sapphire laser at 820 nm with a ps pulse train using LBO (Lithium triborate (LiB3O5)) and BBO crystals in resonant doubling cavities has been demonstrated to have a 25 mW output at 205 nm with an overall conversion efficiency of 4.5%.

Although no intra-cavity frequency doubling has been reported in the deep UV band with a wavelength of less than 240 nm, continuous wave (CW) intra-cavity generation at 320 nm UV wavelength with a conversion efficiency of 35% has been demonstrated using an optically pumped red-emitting Pr:BaY$_2$F$_8$ crystal and a LBO nonlinear optical crystal (NLC) as described in Reference 8 below, which is incorporated herein by reference. Also, over 5 W of continuous wave (CW) power in the visible (585 nm) has been demonstrated with intracavity frequency doubling using an optically pumped vertical extended cavity surface emitting laser (VECSEL) emitting at 1170 nm and a LBO NLC with a conversion efficiency of >58% as described in Reference 2 below, which is incorporated herein by reference.

Another possible chip-scale approach is to use a semiconductor-based nonlinear element, such as GaN, in a resonant cavity, such as a micro-ring resonator, to achieve on-chip frequency doubling. However, the second harmonic generation (SHG) power levels demonstrated so far using this approach have been quite low, with power levels on the order of a few microwatts measured at a wavelength of 780 nm using >100 mW of pump power at 1550 nm, which is a conversion efficiency of <0.01%. Furthermore, GaN cannot be used for second harmonic generation (SHG) generation at 220-240 nm wavelengths because of its absorption.

REFERENCES

The following references are hereby incorporated by reference as though set forth in full.
1. R. G. Smith, IEEE J. Quant. Electr., Vol. QE-6, p. 215 (1970).
2. M. Fallahi et al., IEEE PTL, Vol. 20, p. 1700 (2008).
3. J. W. Raring et al., Appl. Phys. Express, Vol. 3, p. 112101-1 (2010).
4. S. R. Selmic et al., IEEE Photonics Tech. Letter, Vol. 14, p. 890 (2002).
5. B. Agnarsson et al., Optics Express, Vol. 19, p. 22929 (2011).
6. M. Kuwabara et al., Japanese Journal of Appl. Phys., Vol. 52, p. 08JG10 (2013).
7. L. Deyra et al., Optics Letters, Vol. 39, p. 2236 (2014).
8. A. Richter et al., Optics Express, Vol. 14, p. 3282 (2006).
9. H. B. Sun et al., Proc. SPIE, Vol. 3885, p. 311 (1999).
10. B. Agnarsson et al., Optics Express, Vol. 19, p. 22929 (2011).
11. S. Ghosh et al., Phys. Rev. B., Vol. 65, p. 075202 (2002).
12. D. Feezell et al., Japanese Journal of Appl. Phys., Vol. 46, p. L284 (2007).
13. N. Eriksson et al., IEEE JQE, Vol. 32, p. 1038 (1996).
14. A. Yariv, "Photonics: Optical electronics in modern communications," 2007, New York: Oxford University Press.
15. J. E. Epler, Electronics Lett., Vol. 23, p. 754 (1987).
16. R. M. Farrell et al., Appl. Phys. Express, Vol. 4, p. 092105 (2011).

What is needed is an improved chip-scale ultra-violet laser. The embodiments of the present disclosure answer these and other needs.

SUMMARY

In a first embodiment disclosed herein, a chip scale ultra violet laser source comprises a substrate, a plurality of chip scale ultra violet laser elements on the substrate, wherein each chip scale ultra violet laser element comprises a back cavity mirror, a tapered gain medium coupled to the back cavity mirror, an outcoupler coupled to the tapered gain medium, a nonlinear crystal coupled to the outcoupler at a front facet of the nonlinear crystal, wherein the front facet has a first coating that has anti-reflectivity (AR) to a fundamental wavelength of the laser element and high reflectivity (HR) to ultra violet wavelengths, and wherein an exit facet of the nonlinear crystal has a second coating that has HR to a fundamental wavelength of the laser element and AR to the ultra violet wavelengths, a photodetector coupled to the outcoupler, a phase modulator coupled to the photodetector and coupled to the back cavity mirror, and a master laser diode on the substrate coupled to the phase modulator of each laser element and coupled to the photodetector of each laser element, wherein each laser element emits an ultra violet beamlet from the exit facet, and wherein each laser element is frequency and phase locked to the master laser diode.

In another embodiment disclosed herein, a method of fabricating a chip scale ultra violet laser source comprises forming an InGaN/GaN MQW blue laser epi structure on a m-plane GaN substrate, defining a distributed Bragg reflector master laser in the epi, forming a plurality of chip scale ultra violet laser elements on the substrate, wherein forming each chip scale ultra violet laser element comprises forming a back cavity distributed Bragg reflector (DBR), forming a tapered gain medium coupled to the back cavity DBR, forming an outcoupler grating coupled to the tapered gain medium, forming a nonlinear crystal coupled to the outcoupler at a front facet of the nonlinear crystal, wherein the front facet has a first coating that has anti-reflectivity (AR) to a fundamental wavelength of the laser element and high reflectivity (HR) to ultra violet wavelengths, and wherein an exit facet of the nonlinear crystal has a second coating that has HR to a fundamental wavelength of the laser element and AR to the ultra violet wavelengths, forming a photodetector coupled to the outcoupler grating, and forming a phase modulator coupled to the photodetector and coupled to the back cavity DBR.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure describes a chip-scale intra-cavity frequency multiplied ultra-violet (UV) (200-400 nm) laser source with on-chip coherent beam-combining and phase-locking capability that produces a high power (>1 W CW) ultra-violet laser light with high spectral quality with a linewidth of less than 0.01 nm and spatial beam quality of ($M^2$<2) in a small package with a volume of less than 0.1 $cm^3$ with a wall-plug efficiency of greater than 10%. All the required functionalities may be provided in a small, fully-integrated chip of less than 1×0.2×0.5 $cm^3$ in volume.

A heterogeneously integrated optical cavity is disclosed that has a high power tapered optical amplifier structure for providing high optical gain for the fundamental mode in the laser cavity, and a curved detuned second-order grating outcoupler structure 14 with a nonuniform grating duty cycle for providing a well-collimated outcoupling of the fundamental mode into a nonlinear crystal 16 for frequency conversion. The end mirrors in each chip-scale UV lasing element for the fundamental laser oscillation mode are provided by distributed Bragg reflectors (DBRs) 34 at the back end of the tapered optical amplifier structure, and a high reflectivity coating 32 on the output facet of the nonlinear crystal 16.

The present disclosure also describes on-chip coherent beam combining of an array of chip-scale UV laser elements with an integrated phase locking network for efficient power scaling of the emitted ultra-violet light.

Figures 1A, 1B:
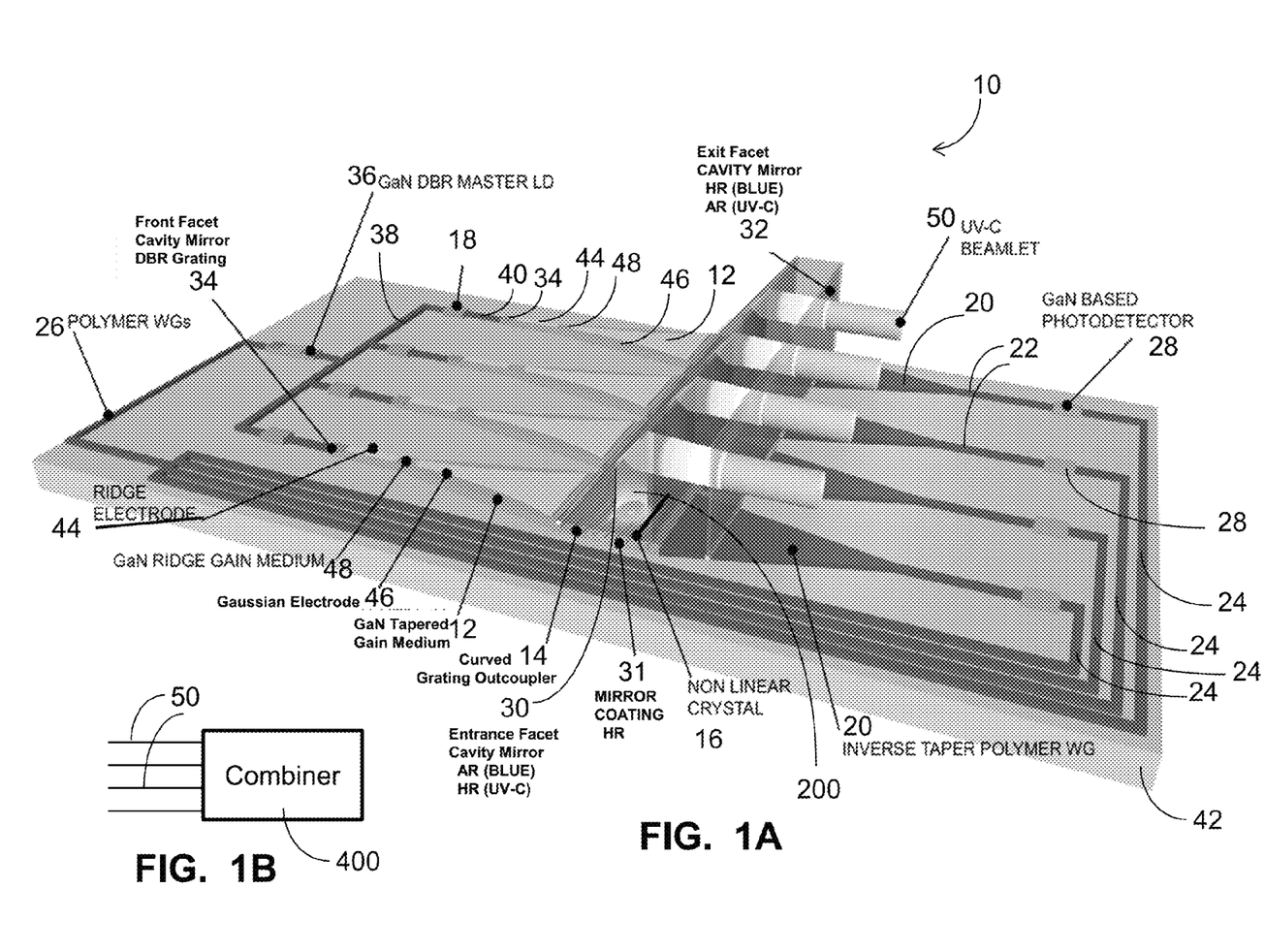
FIGS. 1A and 1B show an integrated chip-scale UV laser with coherent beam combining and phase locking capability in accordance with the present disclosure.

Now referring to FIG. 1A, the chip-scale UV laser source 10 is composed of an array of coherently combined and phase-locked chip-scale UV lasing elements. The optical cavity of each chip-scale UV lasing element consists of: a Ga ridge gain medium 48 with a ridge gain electrode 44, a GaN tapered gain medium 12 with a Gaussian electrode 46 to provide a semiconductor-based tapered semiconductor optical amplifier (SOA) structure that provides a high gain medium for the generation of a high power fundamental mode in the blue UV region (440-460 nm); a detuned second-order curved grating outcoupling structure 14 for collimated and uniform out-coupling of the fundamental mode; and a prism 90 for reflecting the outcoupled fundamental mode into a heterogeneously integrated nonlinear optical crystal (NLC) 16 for frequency multiplying of the fundamental mode in the blue region (440-480 nm) to generate UV in the 220-240 nm wavelength range.

The curved detuned second-order grating out-coupler structure 14 has a nonuniform grating duty cycle and provides a well-collimated outcoupling 200 of the fundamental mode of the laser cavity with high efficiency (>97%) and high power density for pumping the nonlinear crystal 16 integrated above the semiconductor-based chip for efficient harmonic UV generation.

An integrated phase locking network, which ensures robust coherent beam combining, extracts a small sample of the fundamental mode from each chip-scale UV lasing element via its grating outcoupler 14 and optically mixes it with a sample of the master laser 36 in a photodetector 28 for phase detection and phase locking by the phase modulators 18.

An integrated semiconductor-based single mode visible or near-IR master laser diode 36 locks by optical injection the frequency of the free-running chip-scale UV lasing elements. The integrated phase modulators 18 operate together with the photodetectors 28 for each chip-scale UV lasing element to provide phase control for coherent combining. The photodetectors 28 integrated on the chip detect the optical phase of each chip-scale UV lasing element and the phase of the master laser diode 36 to provide feedback to the phase modulators 18 for maintaining phase lock for each chip-scale UV lasing element. The inverse tapered waveguides 20, and waveguides 22, 24, 26, 38 couple the photodetectors 28 and the phase modulators 18. A person skilled in the art would understand that the feedback from the photodetectors 28 to the phase modulators 18 may be made by many other connections.

The result is a fully integrated chip-scale UV optical source with a single spatial and spectral-mode output beam, and with power scaling capability. The chip-scale UV laser source can be considered an "internally pumped" frequency-doubled laser cavity with a high frequency conversion efficiency of greater than 35%, and, hence, a high overall wall-plug efficiency (WPE) of greater than 10%. This WPE value is very difficult to match with direct electrical injection UV laser diode structures due to the extremely challenging material issues associated with the required higher bandgap AlGaN-based structures. Nevertheless, the chip-scale coherent beam-combining and phase-locking scheme described in the present disclosure can be used with direct injection UV laser diodes.

The chip-scale intra-cavity frequency-doubled UV laser structure, shown in FIG. 1A, emits in the deep UV 220-240 nm wavelength (UV-C) band. It consists of a tapered GaN-based optical gain structure 12 for generating a high-power fundamental optical mode in the blue region, and a curved grating out-coupler 14 with a nonuniform duty cycle for redirecting and collimating the fundamental optical mode with high power density onto the nonlinear crystal (NLC) 16, which is heterogeneously integrated with the chip for second harmonic generation (SHG) within the cavity. The NLC 16 has on its exit facet 32 a first coating with high reflectivity (HR) for the fundamental (blue) mode and anti-reflectivity (AR) for the second harmonic (UV), which results in the fundamental mode being reflected from the first coating and the UV being transmitted through the first coating. The NLC 16 also has a second coating on its entrance facet 30 reverse reflectivities of anti-reflectivity (AR) for the fundamental (blue) mode and high reflectivity (HR) for the second harmonic (UV), which results in the UV being reflected from the second coating and the fundamental mode being transmitted through the second coating.

On-chip coherent beam combining of a small array of the chip-scale UV laser elements is achieved by injection-locking them to a single-mode GaN-based master laser diode 36 emitting at the fundamental (blue) wavelength, and phase controlling them via optical phase modulators 18 placed between the master laser 36 and each chip-scale UV laser element. The optical phase modulators 18 operate in the blue wavelength band and are based on an efficient thermo-optic effect in low-loss polymer waveguides. The optical phase modulators 18 may include a heater 82, as shown in FIG. 7. The same polymer material can be used in passive low loss waveguide structures 24 and 26 to couple the master laser diode 36 to the photodetectors 28, passive low loss waveguide structure 38 to couple the master laser diode 36 to the optical phase modulators 18, and passive low loss waveguide structures 20 and 22 to couple the curved grating outcoupler 14 to the photodetectors 28.

On-chip phase locking of UV beamlets 50, which exit the facet facet 32 of the nonlinear crystal 16, is achieved by interfering a small sample of their fundamental mode with that of the master laser 36 using an array of polymer waveguides 20, 22, 24 and 26 and GaN-based photodetectors 28 and phase modulators 18 formed on the chip to detect and lock the optical phase of each chip-scale UV lasing element to that of the master laser 36. The extraction of the fundamental mode samples of each chip-scale UV lasing element is obtained via a small leakage through each curved grating out-coupler 14, which is then coupled to the polymer waveguide array 20, as shown in FIG. 1A.

The efficiency of second harmonic generation (SHG) using the NLC 16 is strongly dependent on the power density of the fundamental mode laser power incident on the NLC 16. Usually the most efficient SHG is obtained using very high peak power lasers with greater than 1 GW/cm$^2$) which have a large size, weight and power (SWaP), which is unsuitable for the chip-scale implementation. Thus, achieving an intra-cavity SHG in a semiconductor-based laser resonator with limited fundamental mode optical power is highly desirable.

In resonators with intra-cavity SHG, the conversion rates for the forward (+) and backward waves (−) in the NLC 16 of thickness l is given by Equation [1].

$$\eta^{\pm}(l) = \frac{P_{2\omega}^{\pm}(l)}{P_{\omega}^{\pm}} = \frac{8\pi^2 d_{e\!f\!f}^2}{n_{2\omega} n_{\omega}^2 c \varepsilon_0} \frac{l^2}{\lambda_{\omega}^2} \mathrm{sinc}\left(\frac{\Delta k l}{2}\right)^2 \frac{P_{\omega}^{\pm}}{A_{e\!f\!f}} \qquad [\text{Eq. 1}]$$

Here, $d_{e\!f\!f}$ is a non-linear coefficient, $A_{e\!f\!f}$ is the effective cross section of the fundamental mode beam, with the resulting beam intensity, $P_{\omega}^{\pm}/A_{e\!f\!f} \equiv I_{\omega}^{\pm}$. In laser resonators with high reflection (HR) mirrors, meaning when simultaneous extraction of the fundamental mode is not desired, $P_{\omega}^{+} \approx P_{\omega}^{-}$ and, consequently, $P_{2\omega}^{+} \approx P_{2\omega}^{-}$. The $$\mathrm{sinc}\left(\frac{\Delta k l}{2}\right)$$

term in Eq. 1 reaches its maximum of unity in the case of phase-matched operation, with $\Delta k \propto n_{2\omega} - n_{\omega} \equiv 0$. Maximum second harmonic power extraction, neglecting extraction of the fundamental mode, takes place when $(\eta^{+} + \eta^{-})$ is matched to internal optical losses in the resonator. Energy conservation requires that optical intensity-dependent gain is balanced by internal losses plus SHG, setting the intensity of the fundamental mode. Forward and backward second harmonic (SH) propagating beams can be utilized independently or combined together by means of internal mirrors. In this case, careful phase matching of the forward and backward second harmonic (SH) waves is desired for the optimal power extraction. With optimum phase matching, conversion efficiencies of greater than 35%, which is the ratio of the generated second harmonic power to the pumped fundamental mode power, lasers can be achieved in intra-cavity SHG lasers, as described in Reference 2 above, which is incorporated herein by reference.

As an example, using a BBO nonlinear crystal with $d_{eff} \approx 2$ pm/V for SHG, $n_\omega \approx n_{2\omega} \approx 1.75$, and with the proper crystal cut allowing optimal second harmonic generation, $P_{2\omega}^\pm$, $P_\omega^\pm$ (in Watts) for $\lambda_\omega = 2\lambda_{2\omega} = 450$ nm is given by Equation 2:

$$P_{2\omega}^\pm = 1.1 \times 10^{-7} (P_\omega^\pm)^2 L^2 / A_{eff} \qquad [\text{Eq. 2}]$$

Figure 2:
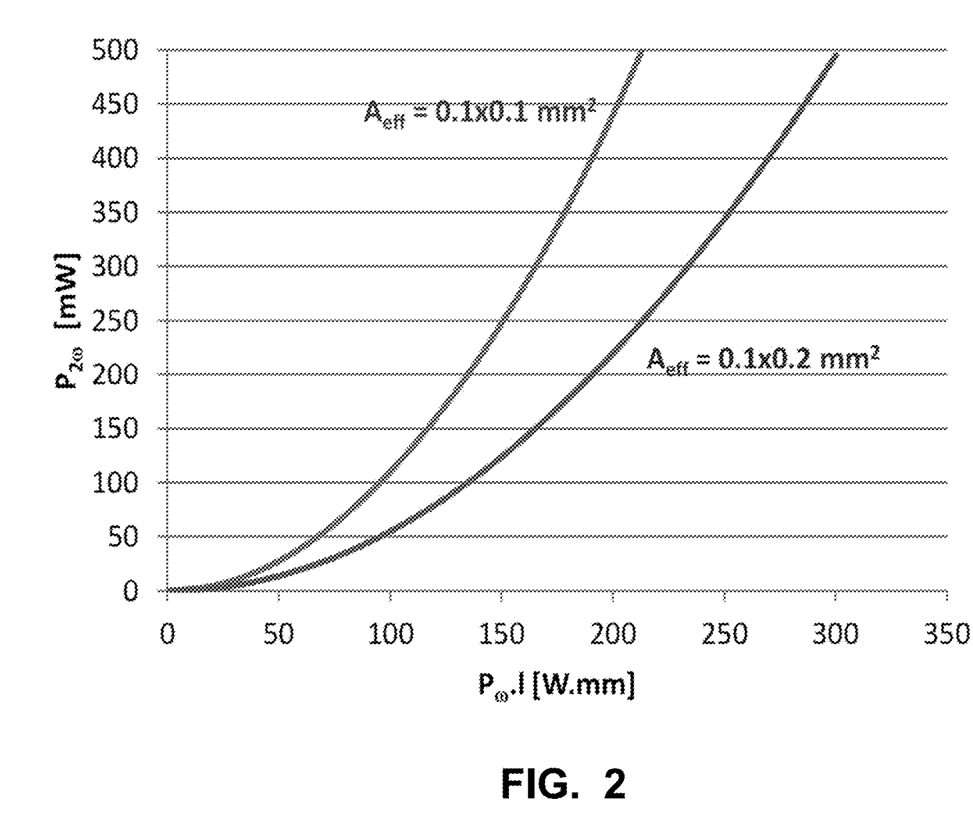
FIG. 2 shows a graph of the dependence of the $2^{nd}$ harmonic optical power on the product of the intra-cavity fundamental mode power and NLC thickness for two different beam cross-section areas in accordance with the present disclosure.

For a realistic $A_{eff} = 0.1 \times 0.2$ mm$^2$ obtained by the width of the tapered gain structure 12 and the matching dimensions of the curved grating outcoupler 14, as further described below, and the product of the optical power of the fundamental mode in the cavity and the NLC 16 length of $P_\omega^\pm l \approx 200$ W·mm, the extracted second harmonic power is $P_{2\omega}^+ = P_{2\omega}^- = 200$ mW, as shown in FIG. 2, which shows the dependence of $2^{nd}$ harmonic optical power on the product of the intra-cavity fundamental mode power and NLC 16 thickness for two different beam cross-section areas. Using a meaningful BBO crystal 16 ranging in thickness from 1 mm to about 5 mm, the power density of the fundamental mode at the end of the semiconductor optical amplifier (SOA) taper is estimated to be about 80 MW/cm$^2$ assuming about 1 μm mode size in the vertical direction, which is consistent with the power densities obtained in high-power blue laser diodes, as described in Reference 3 above, which is incorporated herein by reference. However, other considerations such as the effect of high power densities in the tapered gain structure on the spatial mode profile and, hence, beam quality or the $M^2$ value, need to be considered.

The SHG power levels of 400 mW per chip-scale UV lasing element for the above example requires the power combining of 3 such lasing elements for a total ultra violet chip scale output power of approximately 1 W, with a coherent beam combining efficiency of 0.9. A combiner 400, as shown in FIG. 1B, may be used to combine the UV beamlets 50 in order to add their laser power.

Another consideration is the acceptance angle of the NLC 16. For the above example of using a BBO crystal, the acceptance angle at 450 nm fundamental wavelength is about 1 mrad cm. For a BBO thickness of 5 mm used here, the acceptance angle of 2 mrad is consistent with the beam divergence of about 2.3 mrads obtained using a curved grating outcoupler 14 structure with a dimension of 0.2 mm in the critical crystal direction.

In short, a trade-off among the above device parameters, namely, the taper and grating outcoupler 14 dimensions, the NLC 16 thickness, and the number of chip-scale UV lasing elements needs to be made with respect to the output beam quality and power level. Other considerations include the spatial profile and finite linewidth of the fundamental mode, the NLC 16 walk-off angle, and the reflectivity of the cavity mirrors provided by coating 32 and DBR grating 34.

Maximum SHG conversion efficiency may be achieved by matching the optical phase of the fundamental mode and the second harmonic UV optical beams in the NLC 16. This phase matching may be obtained by an accurate cut of the birefringent nonlinear crystal 16, as well as with a precise heterogeneous integration of the NLC 16 with the GaN chip to control the tilt angle to be less than 1 mrad. Also, by fine tuning the wavelength of the fundamental mode by about 0.01 nm in the injection-locked chip-scale UV lasing elements via the master laser diode 36 drive current, the constructive interference between the beams of the fundamental mode in the forward and backward directions can be maximized in order to maximize the intensity of the fundamental mode incident on the NLC 16 following reflection from an intra-cavity high reflectivity (HR) mirror coating 31 placed below the outcoupler grating. This is further described below.

Blue laser diodes based on the InGaN/GaN MQW optical gain structures have achieved significant progress in recent years, demonstrating peak WPE values of about 23% WPE values and single-lateral-mode output powers of greater than 750 mW, as described in Reference 3 above, which is incorporated herein by reference. In order to increase the power density of the fundamental blue mode in each chip-scale UV lasing element cavity, the volume of the GaN gain region may be increased. However, simply increasing the width of the single-lateral-mode gain medium is not sufficient since filamentation and multimode operation limits the power density of the fundamental mode below the levels required for efficient frequency conversion.

Figure 3:
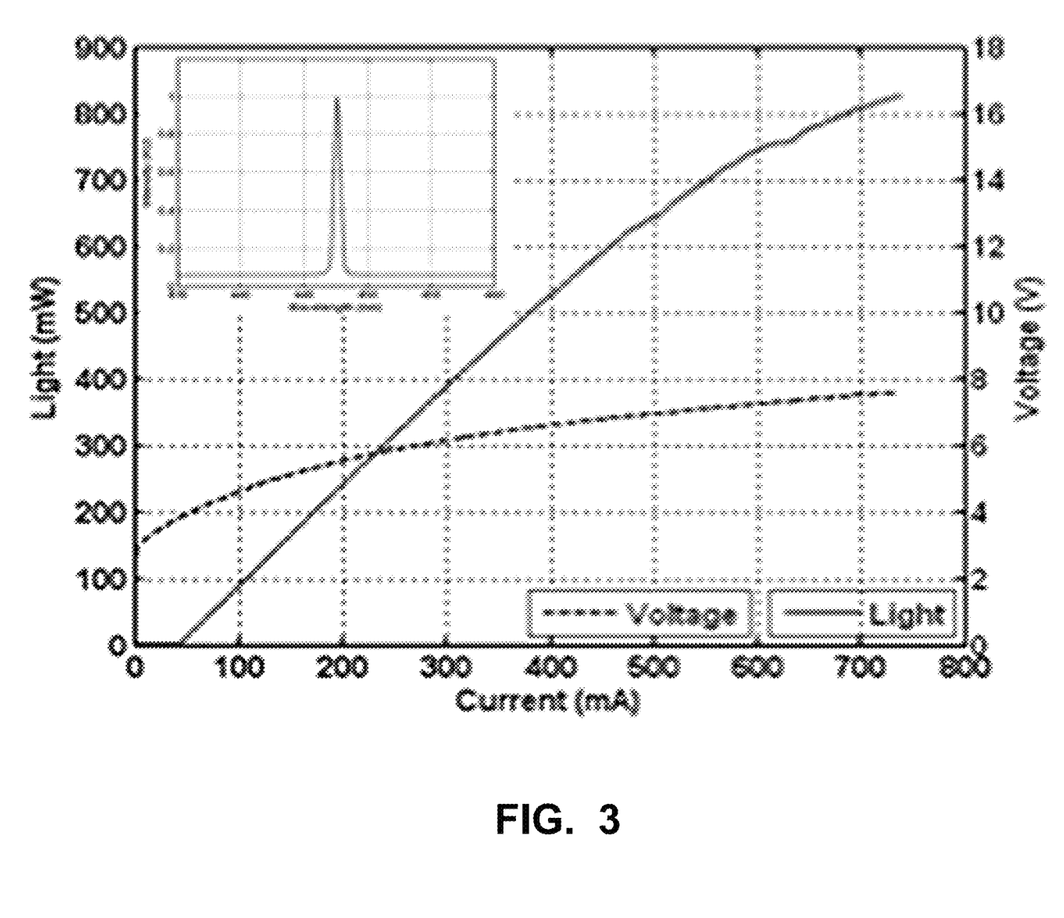
FIG. 3 shows a graph of CW output power of more than 750 mW demonstrated in single-lateral-mode blue (447 nm) laser diodes grown on nonpolar GaN substrates in accordance with the present disclosure.

A tapered semiconductor optical amplifier (SOA) 12 using a highly efficient blue InGaN/GaN multiple quantum well (MQW) structure is grown on a nonpolar GaN substrate 42 as the optical gain medium 12 for the chip-scale UV lasing element. Growth on these GaN crystal planes eliminates the internal polarization-related fields which result in the separation of the electron and hole wave functions in the MQW gain medium, and, hence, reduce the radiative recombination rates. FIG. 3 shows CW optical powers of greater than 750 mW obtained in single-lateral-mode ridge waveguide laser diodes at 447 nm grown on nonpolar GaN substrates.

As shown in FIG. 1A, the GaN-based gain structure has a GaN ridge gain medium 48 with a ridge electrode 44 on the GaN ridge gain medium 48, which allows a single-lateral-mode, and a GaN tapered gain region 12 with a Gaussian electrode 46 on the GaN tapered gain region 12, which increases the gain volume. The distributed Bragg reflector (DBR) grating 34 is before the ridge waveguide region 44 to define the single-longitudinal spectral mode, together with a similar design for the grating outcoupler 14. A Gaussian injection current profile is formed by using the Gaussian electrode 46 on the tapered gain region 12, as shown in FIG. 1A, to match the lateral mode profile in order to reduce self-focusing and beam instability effects. This approach has been successfully used in the near-IR tapered laser structures described in Reference 4 above, which is incorporated herein by reference. The combination of the single-lateral and single-longitudinal mode design ensures both close-to-diffraction-limited ($M^2 < 2$), and a narrow linewidth ($\Delta\lambda < 0.01$ nm) frequency doubled UV-C output beam 50.

The recirculating fundamental mode in the chip-scale UV lasing structure is outcoupled from the GaN tapered gain medium 12 to the NLC 16 via a specially designed slightly detuned second-order surface emitting grating outcoupler 14. The grating 14 has a tailored curvature to outcouple a collimated beam to the NLC 16 in order to increase the SHG conversion efficiency. This curved grating structure 14 has a number of parameters, such as its shape, depth, refractive index, duty cycle, and pitch that need to be optimized for efficient radiation into the NLC 16. One key parameter is the duty cycle of the grating 14 that needs to be tailored in order to form an outcoupled beam intensity profile with a super-Gaussian shape to facilitate single-transverse-mode generation of the fundamental frequency in the cavity. Also, by implementing a small nonuniformity in the grating period in its beginning and ending sections, the collimation of the outcoupled beam can be optimized.

Since a fraction of the tapered amplifier fundamental mode is outcoupled from the grating outcoupler 14 in the substrate 42 direction, a multilayer GaN/InGaN mirror 31 with HR to the fundamental mode is placed below the outcoupler grating 14 at the position of the lower cladding layer. By choosing the proper thickness for the lower cladding layer, the outcoupled fraction of the beam in the substrate direction is reflected back and constructively interferes with the fraction outcoupled into air in order to maximize the intensity of the fundamental mode incident on the NLC 16. Furthermore, by the proper design of the outcoupler grating 14 length and duty cycle distribution, a controlled fraction (<1%) of the total fundamental power is allowed to transmit through the grating outcoupler 14 to the inverse taper polymer waveguide 20 for phase locking, as described above.

Figure 4A:
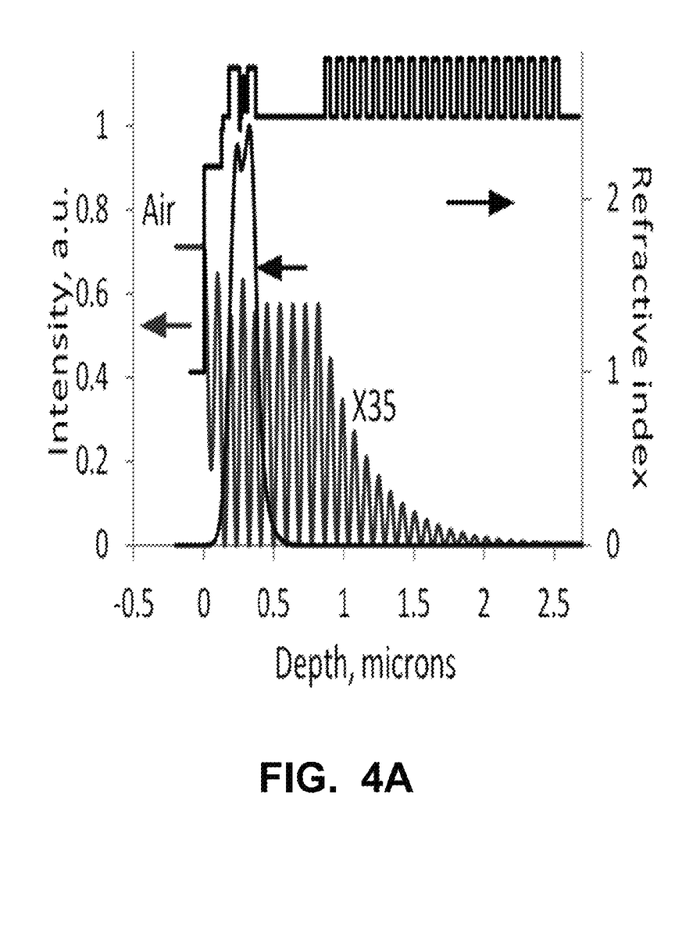
FIG. 4A shows intensity distributions of the guided and radiation modes along the depth of the structure, and the refractive-index profile.
Figure 4B:
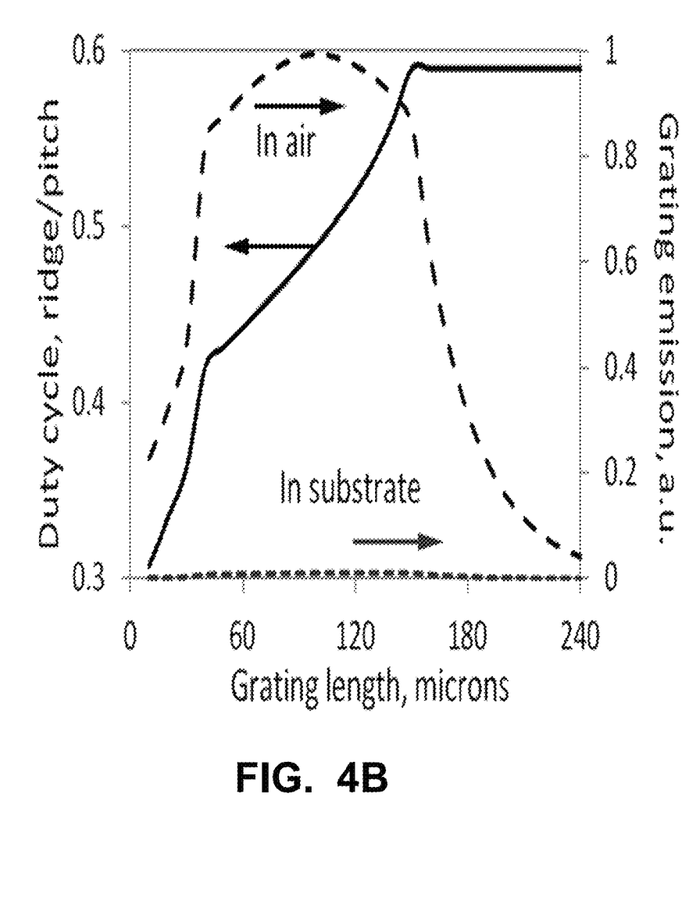
FIG. 4B shows the duty cycle distribution vs. grating length and corresponding relative emission in air and in the substrate in accordance with the present disclosure.

FIG. 4A shows intensity distributions of the guided and radiation modes along the depth of the structure, and the refractive-index profile, including the grating region, the waveguide core and lower cladding, and the 20 pair GaN/InGaN multilayer mirror. FIG. 4B shows the duty cycle distribution vs. grating length and corresponding relative emission in air and the substrate. The simulation results shown in FIGS. 4A and 4B are for the grating outcoupler 14 with a pitch and depth of 185 nm and 130 nm, respectively. The refractive index profile in the vertical direction, including those of the waveguide and the multilayer mirror 31, as well as the optical mode and intensity profiles in air and in the substrate 42 are shown in FIG. 4A. The duty cycle profile and the resulting outcoupled super-Gaussian profile are shown in FIG. 4B. An outcoupling efficiency of greater than 99%, integrated over the beam profile, may be achieved.

Coherent beam combining of multiple injection-locked chip-scale UV lasing elements for UV power scaling requires $2\pi$ phase control. In the embodiment of FIG. 1A, a polymer-based thermo-optic phase modulator 18 with an integrated heater is integrated before each chip-scale lasing element. The polymer waveguide structure 18 is based on a poly(methyl methacrylate (PMMA) core layer, with a refractive index of ~1.49 in the visible, and a fluorinated polymer, such as CYTOP, with a refractive index of ~1.34, as the upper and lower cladding layers. The relatively high index contrast of $\Delta n \sim 0.15$ allows good mode confinement and compact bending of the waveguide 18. Given the thermo-optic coefficient of $10^{-4}/°K$ for this polymer, as described in Reference 5 above, which is incorporated herein by reference, a phase modulator 18 length of only 450 μm will result in $2\pi$ phase change with only 10° C. of temperature control at a wavelength of 450 nm, since $\Delta\phi = 2\pi(dn/dT)\Delta T L/\lambda$, where $\Delta\phi$ is the optical phase change, do/dT is the thermo-optic coefficient, $\Delta T$ is the temperature control range, L is the modulator length, and $\lambda$ is the free-space wavelength. Also, the propagation loss of ~3 dB/cm demonstrated for these waveguides 18 result in a very small insertion loss of <0.15 dB for the polymer phase modulators 18.

Phase locking of the injection-locked chip-scale UV lasing elements is required for optimum coherent beam combining. Although the phase control for each element is provided by the integrated polymer phase modulators 18 described above, an efficient means for ensuring phase locking is required.

In the present disclosure phase locking is achieved by first extracting a small fraction (<1%) of the fundamental mode in each chip-scale UV lasing element, which is designed to leak through the grating outcoupler 14 structure, and then coupling it to the polymer waveguide network 20, 22, 24 and 26 formed on the chip, as shown in FIG. 1A. The sample of the fundamental mode is then mixed with a fraction of the master DBR laser 36 reference beam, sampled through the backside DBR mirror 34, in a GaN-based waveguide photodetector 28, as shown in FIG. 1A. The network of low-loss polymer waveguides 20, 22, 24, 26 and 38 formed on the chip, couple the extracted beams from the master DBR laser diode 36 and fundamental mode of the chip-scale UV lasing elements to the photodetectors 28 for phase locking. The interference of the master laser and sampled UV beamlets 50 in the photodetector 28 is given by Equation 3:

$$I_{PDi}\eta_{PD}(P_r + P_i + 2\sqrt{P_r P_i} \cos(\Delta\phi_i - \phi_{0i})) \quad [\text{Eq. 3}]$$

where, $I_{PDi}$ is the photodetector current for the $i^{th}$ chip-scale UV lasing element, $\eta_{PD}$ is the photodetector 28 conversion efficiency, $P_r$ and $P_i$ are the optical power extracted from the master laser 36 and the $i^{th}$ chip-scale lasing element incident on the photodetector, respectively, $\Delta\phi_i$ is the optical phase difference between the master laser 36 and the $i^{th}$ chip-scale UV lasing element, and $\phi_{0i}$ is the phase offset due to possible optical path length differences. By pre-calibrating the values of the fixed parameters $P_r$, $P_i$ and $\phi_{0i}$ for each element, the photocurrent value $I_{PDi}$ for phase locking condition ($\Delta\phi_i = 0$) is obtained.

The process flow for fabrication of the chip-scale UV laser is shown (cross section view) in FIGS. 5A, 5B, 5C, 5D, 5E, 5F, 5G, 5H and 5I.

Figure 5A:
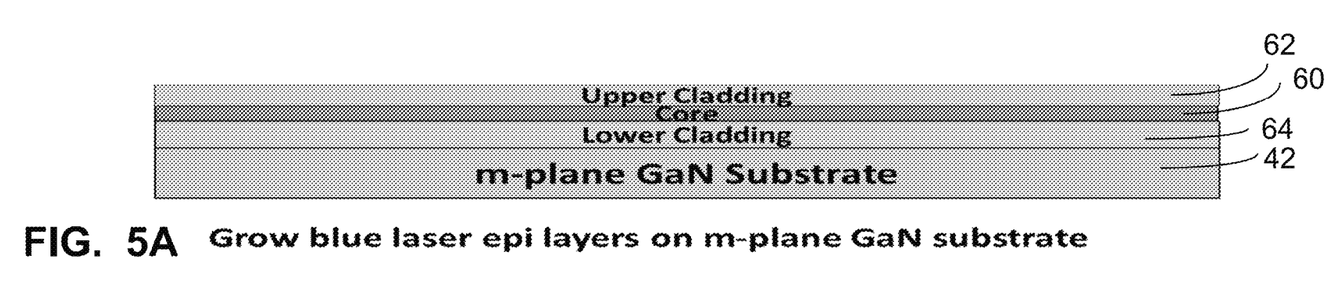
FIGS. 5A, 5B, 5C, 5D, 5E, 5F, 5G, 5H and 5I show a process flow for fabricating a chip-scale UV laser in accordance with the present disclosure.

In the step shown in FIG. 5A, an InGaN/GaN MQW blue laser epi structure is grown on a m-plane GaN substrate 42. A simplified structure comprised of the core 60 and upper 62 and lower 64 cladding layers is shown. Metal-organic chemical vapor deposition (MOCVD) growth of the epilayers is performed at atmospheric pressure using common group III and group V precursors including trimethylgallium, triethylgallium, trimethylindium, trimethylaluminum and ammonia. The n-type dopant utilized may be Si [disilane] and the p-type dopant may be Mg [bis-cyclopentadienylmagnesium]. All layer depositions may be performed at >800 C (optimized for each layer) and with specific flows and other chamber conditions on bulk GaN substrates.

Figures 5B, 5C:
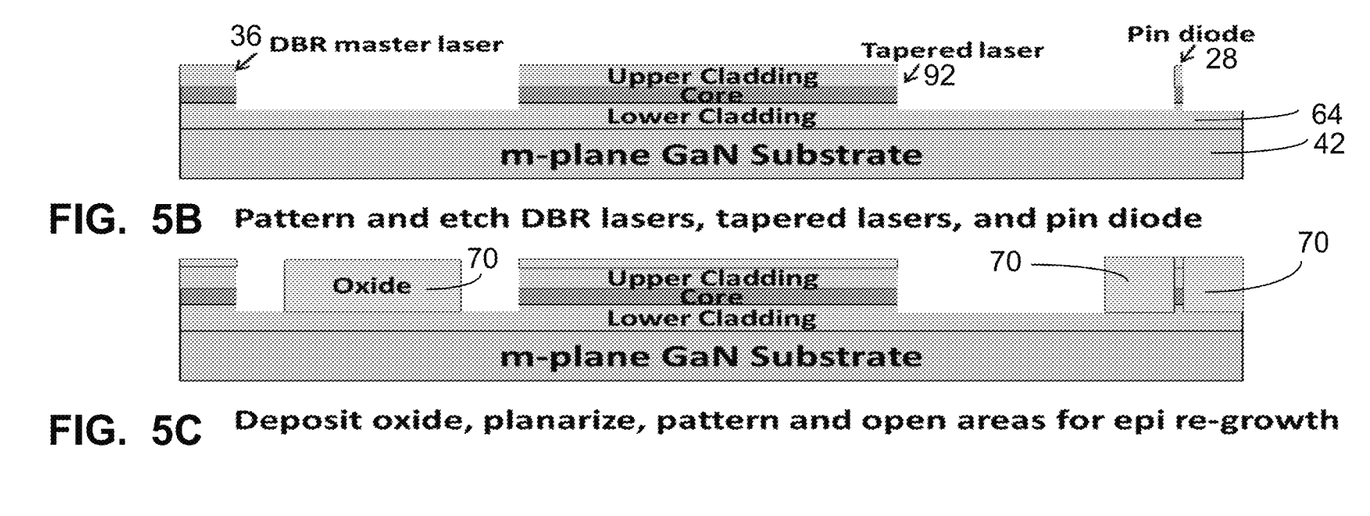
Figure 5D:
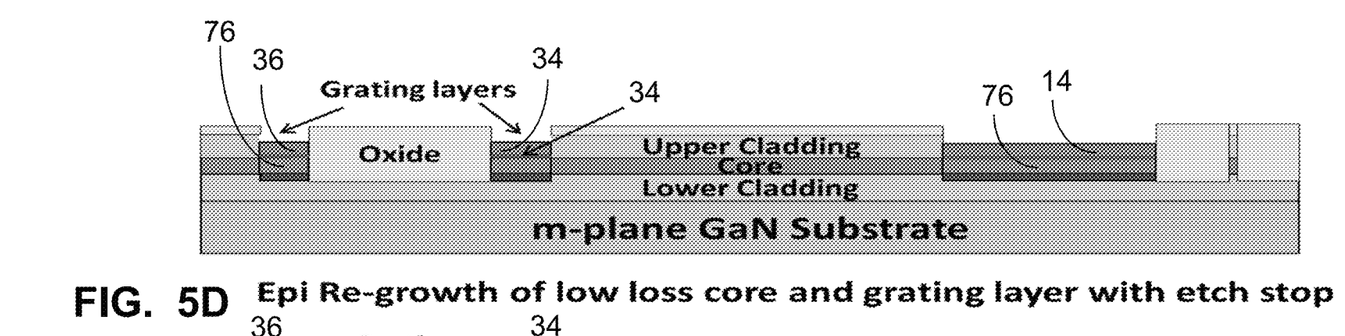

After growth, the active devices, including the DBR master laser 36, the tapered laser gain medium 92, including the ridge electrode 44, the GaN ridge gain medium 48, the Gaussian electrode 46, and the GaN tapered gain medium 12, and the pin photodetector diode 28 are defined with optical lithography and dry etched, as shown in FIG. 5B. The epi layers are then etched down to a GaN layer in the lower cladding region 64, which provides the template for epitaxial re-growth. Oxide 70 is then deposited and windows are opened in the oxide 70 for selective epi re-growth of the out-coupling grating 14, and laser gratings 34 and 36, as shown in FIG. 5C. The total etch depth is about 1.3 microns, and the oxide 70 may be planarized using chemical-mechanical-polish (CMP), if needed, to minimize the effect of this topography on the subsequent patterning of laser gratings 34 and 36 and the out-coupler grating 14. The epitaxial layers that define the laser gratings 34 and 36 and the out-coupler grating 14 are re-grown in the open oxide windows, as shown in FIG. 5D.

Figure 5E:
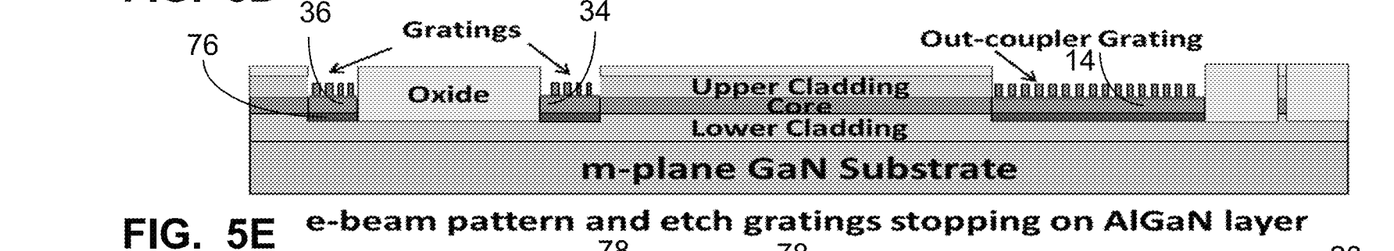
Figure 5F:
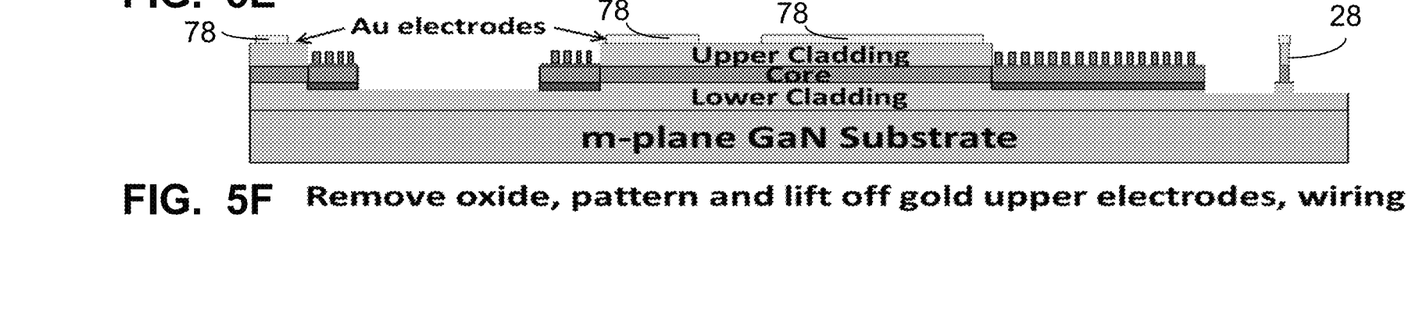

Then as shown in FIG. 5E, the laser gratings 34 and 36 and the out-coupler grating 14 are patterned with e-beam lithography and etched into the 130 nm InGaN top layer of the re-grown structure using a chlorine based inductively coupled plasma (ICP) reactive ion etcher (RIE) to an AlGaN etch stop layer 76. After removing the oxide re-growth mask, electrodes and routing metal 78 are patterned with optical lithography and metal lift-off, as shown in FIG. 5F.

Figure 5G:
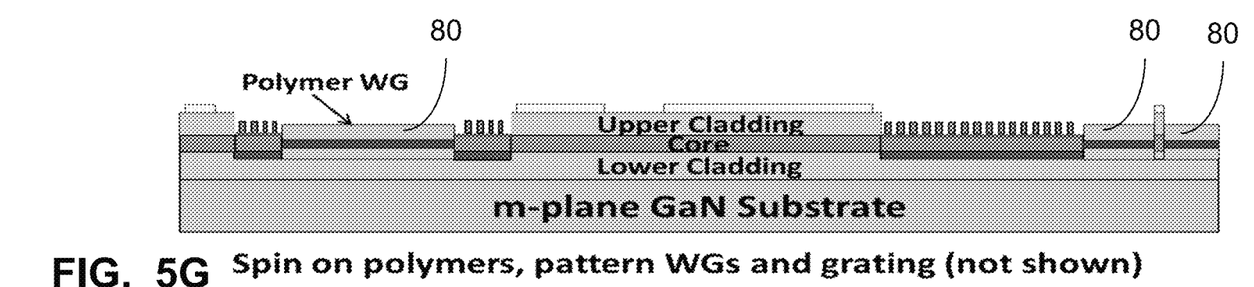
Figure 5H:
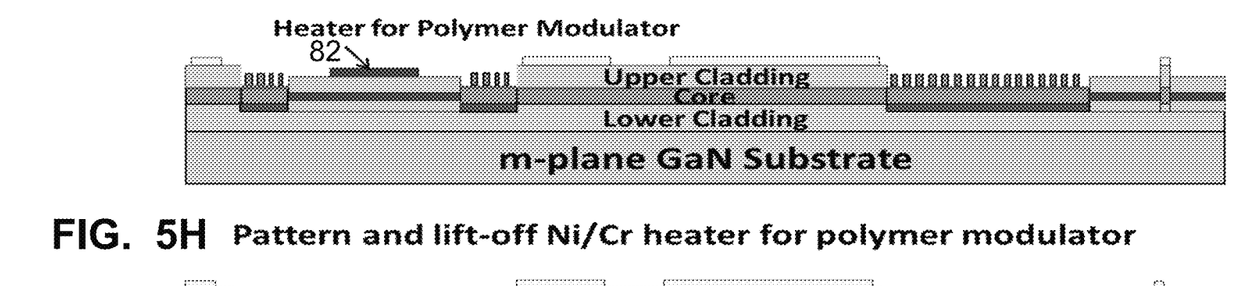
Figure 5I:
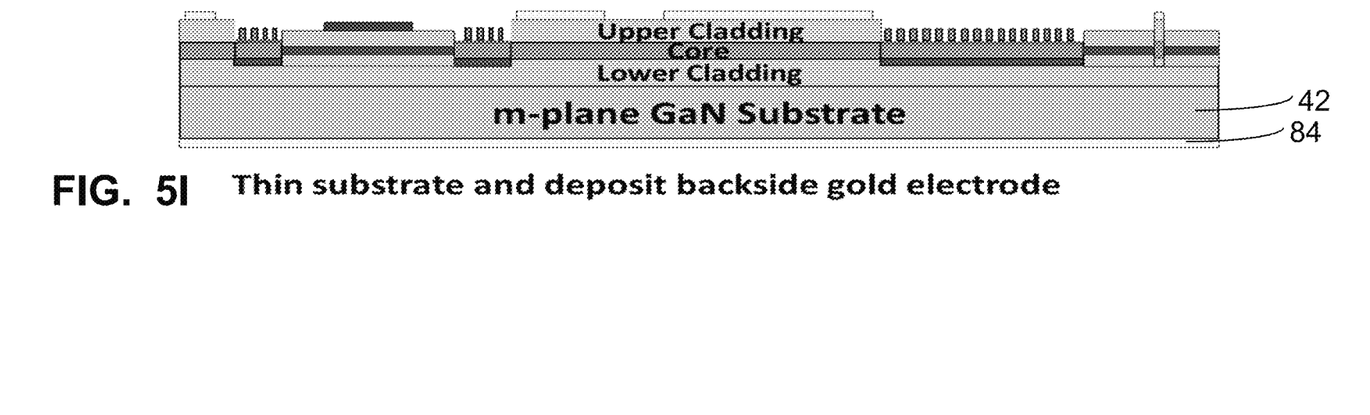

Then the tri-layer polymer waveguide structures 80, including waveguides 20, 22, 24, 26, 38 and 40 are formed with low index polymer cladding layers, flouropolymers and a high index photo-sensitive core layer (PMMA). After spinning on the lower cladding layer 64, the core layer PMMA will be spun on and patterned using e-beam followed by a final layer of flouropolymer for the upper cladding, as shown in FIG. 5G. The tri-layer polymer stack may be used as a thermo-optic modulator by patterning and depositing a Ni/Cr heating element 82 on a section of the polymer waveguide, as shown in FIG. 5H. After the structures are defined on the front side, the substrate is thinned and the backside metal electrode 84 is deposited, as shown in FIG. 5I.

The most lithographically demanding patterning on each chip-scale UV laser element is the curved grating outcoupler 14, which requires minimum features between 80 nm to 100 nm and maintaining line width critical dimensions (CDs) across the continuously varying grating duty cycle. A constant depth over the entire grating is critical to optical performance. Aspect ratio dependent etch rates are typical in dry etch processes whereby smaller openings etch slower than large openings. A solution to provide constant depth is to use an etch stop layer, such as etch stop layer 76 so that the higher aspect ratio areas can be etched longer while not increasing the depth of the larger openings. A thin AlGaN etch stop 76 is used for etching the grating out-coupler 14. In chlorine chemistry the AlGaN:InGaN selectivity is >10:1, which provides the margin needed to etch the grating out-coupler 14.

The final step in the fabrication of the chip-scale UV laser is the bonding of the nonlinear crystal 16, which may be a BBO, above the grating out-coupler 14 for the frequency conversion from blue to UV light. By adding an angled prism 90 to the BBO NLC 16 edge, the long axis of the crystal is parallel to the substrate providing a more robust integration over a vertical structure, where the long axis is perpendicular to substrate, since the aspect ratio of the BBO crystal length to thickness is over 10:1. The BBO NLC 16 may be bonded to the grating out-coupler 14 using Au—Au 100 metal thermo-compression bonding.

A critical parameter for the BBO crystal bonding is the parallelism of the NLC 16 crystal surface to the grating out-coupler 14. State-of-the-art die bonders are capable of leveling two bonding surfaces with a resolution of 4.2 µradians and a sensitivity of 20 µradians, well exceeding the accuracy required for the bonded surfaces here. The distance between the out-coupler 14 and the BBO NLC 16 is also important for loss. The closer the crystal, the lower the loss. In the present disclosure, this distance is controlled by adjusting the thickness of the gold bond pads 100. With metal deposition processes, this thickness can be controlled to within about 50 nm. Bonds have been demonstrated with pads on both sides of the bond pair of 500 nm. The distance between the surfaces can be on the order of 2 to 3 microns.

Figure 6:
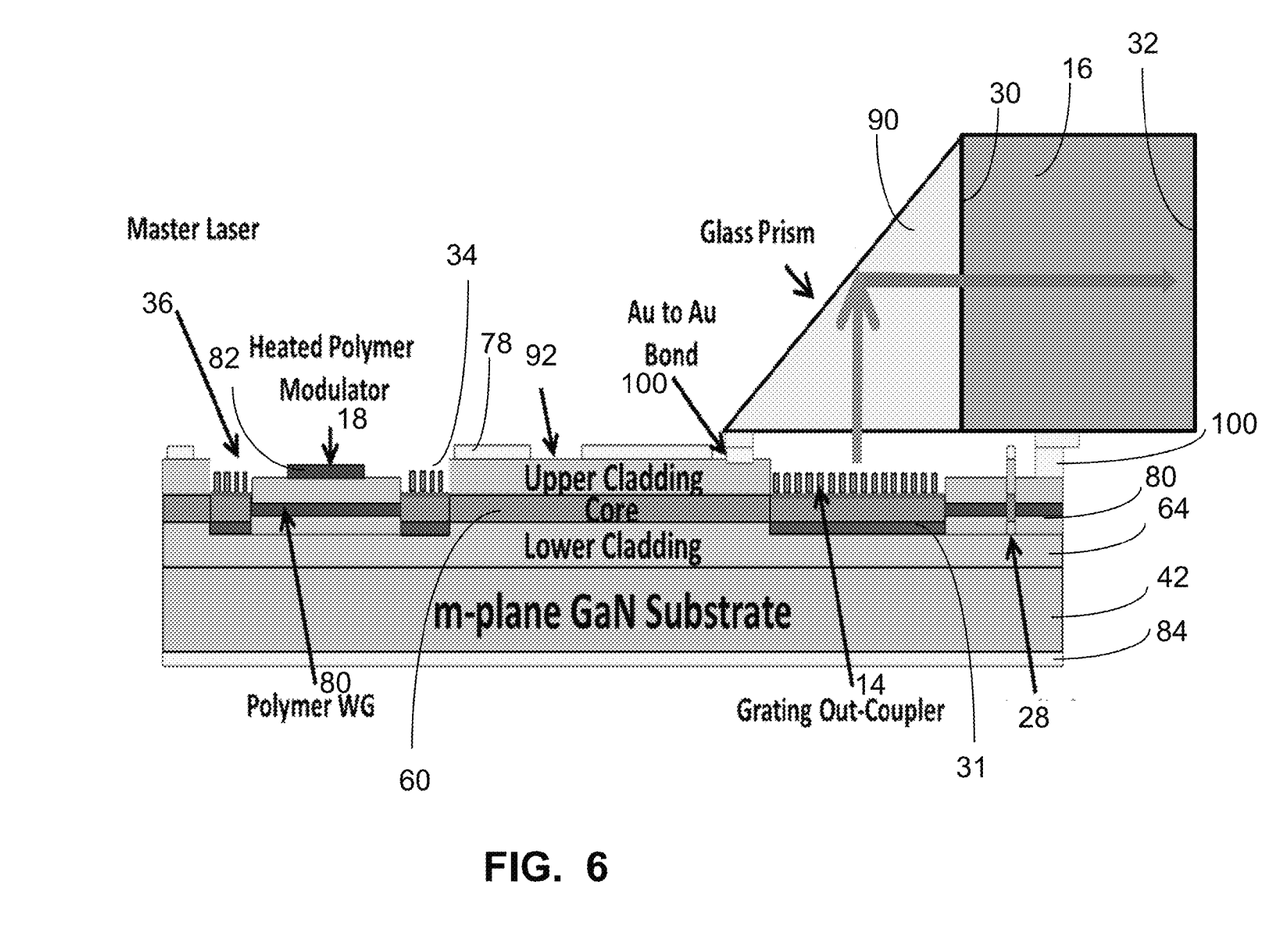
FIG. 6 shows a cross-section view of a chip-scale UV laser with an integrated BBO crystal in accordance with the present disclosure.

A cross-section view of the fully-integrated chip-scale UV laser 10 with a BBO NLC 16 is shown in FIG. 6.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A chip scale ultra violet laser source comprising:
    a substrate;
    a plurality of chip scale ultra violet laser elements on the substrate, wherein each chip scale ultra violet laser element comprises:
        a back cavity mirror;
        a tapered gain medium coupled to the back cavity mirror;
        an outcoupler coupled to the tapered gain medium;
        a nonlinear crystal coupled to the outcoupler at a front facet of the nonlinear crystal, wherein the front facet has a first coating that has anti-reflectivity (AR) to a fundamental wavelength of the laser element and high reflectivity (HR) to ultra violet wavelengths, and wherein an exit facet of the nonlinear crystal has a second coating that has HR to a fundamental wavelength of the laser element and AR to the ultra violet wavelengths;
        a photodetector coupled to the outcoupler;
        a phase modulator coupled to the photodetector and coupled to the back cavity mirror; and
    a master laser diode on the substrate coupled to the phase modulator of each laser element and coupled to the photodetector of each laser element;
    wherein each laser element emits an ultra violet beamlet from the exit facet; and
    wherein each laser element is frequency and phase locked to the master laser diode.

2. The chip scale ultra violet laser source of claim 1:
    wherein the fundamental wavelength comprises wavelengths ranging from 440 nm to 480 nm; and
    wherein the ultra violet wavelengths comprise wavelengths ranging from 220 nm to 240 nm.

3. The chip scale ultra violet laser source of claim 1 wherein each tapered gain medium comprises:
   a GaN ridge gain medium coupled to the back cavity mirror and; and
   a GaN tapered gain medium coupled to the ridge gain medium and to the outcoupler.

4. The chip scale ultra violet laser source of claim 3 wherein each gain medium further comprises:
   a ridge electrode on the ridge gain medium; and
   a Gaussian electrode on the tapered gain medium.

5. The chip scale ultra violet laser source of claim 1 wherein the outcoupler comprises:
   a curved grating outcoupler having a nonuniform grating duty cycle.

6. The chip scale ultra violet laser source of claim 5 further comprising a mirror on the substrate below the curved grating outcoupler, the mirror having high reflectivity.

7. The chip scale ultra violet laser source of claim 5 further comprising a prism coupled between the curved grating outcoupler and the front facet of the nonlinear crystal.

8. The chip scale ultra violet laser source of claim 1 wherein each phase modulator comprises:
   a low-loss polymer waveguide; and
   a heater coupled to the low-loss polymer waveguide.

9. The chip scale ultra violet laser source of claim 1 wherein the master laser diode comprises a single-mode GaN laser diode emitting at the fundamental wavelength.

10. The chip scale ultra violet laser source of claim 1 wherein
    the photodetector is coupled to the outcoupler by an inverse tapered waveguide.

11. The chip scale ultra violet laser source of claim 1 further comprising a combiner for combining the ultra violet beamlets.

12. The chip scale ultra violet laser source of claim 1 further comprising:
    a first plurality of low loss polymer waveguides coupling the master laser diode to the photodetectors;
    a second plurality of low loss polymer waveguides coupling the master laser diode to the optical phase modulators; and
    a third plurality of low loss polymer waveguides coupling the outcoupler to the photodetectors.

13. The chip scale ultra violet laser source of claim 1 wherein the substrate comprises a nonpolar GaN substrate.

14. The chip scale ultra violet laser source of claim 1 further comprising feedback circuitry coupling the photodetector to the phase modulator.

15. The chip scale ultra violet laser source of claim 1 wherein:
    the master laser diode comprises a GaN distributed Bragg reflector; and
    the back cavity mirror comprises a distributed Bragg reflector.

16. A method of fabricating a chip scale ultra violet laser source comprising:
    forming an InGaN/GaN MQW blue laser epi structure on a m-plane GaN substrate;
    defining a distributed Bragg reflector master laser in the epi;
    forming a plurality of chip scale ultra violet laser elements on the substrate, wherein forming each chip scale ultra violet laser element comprises:
       forming a back cavity distributed Bragg reflector (DBR);
       forming a tapered gain medium coupled to the back cavity DBR;
       forming an outcoupler grating coupled to the tapered gain medium;
       forming a nonlinear crystal coupled to the outcoupler at a front facet of the nonlinear crystal, wherein the front facet has a first coating that has anti-reflectivity (AR) to a fundamental wavelength of the laser element and high reflectivity (HR) to ultra violet wavelengths, and wherein an exit facet of the nonlinear crystal has a second coating that has HR to a fundamental wavelength of the laser element and AR to the ultra violet wavelengths;
       forming a photodetector coupled to the outcoupler grating; and
       forming a phase modulator coupled to the photodetector and coupled to the back cavity DBR.

17. The method of claim 16 further comprising:
    using optical lithography and dry etching to form the tapered gain medium and the photodetector;
    etching the epi layers to a GaN layer in a lower cladding region to provide a template for epitaxial re-growth;
    depositing an oxide mask;
    opening windows in the oxide mask for selective epi re-growth for the outcoupling grating, and gratings for the distributed Bragg reflector master laser and the back cavity distributed Bragg reflector (DBR);
    regrowing epitaxial layers in the windows for the outcoupling grating, the distributed Bragg reflector master laser and the back cavity distributed Bragg reflector (DBR);
    patterning and etching gratings for the outcoupling grating, the distributed Bragg reflector master laser and the back cavity distributed Bragg reflector (DBR);
    removing the oxide mask;
    forming electrodes and routing metal using optical lithography and metal lift-off;
    forming tri-layer polymer waveguide structures for waveguides with low index polymer cladding layers, flouropolymers and a high index photo-sensitive core layer (PMMA);
    forming the phase modulator by depositing a Ni/Cr heating element on a section of the tri-layer polymer waveguide structures; and
    depositing a backside metal electrode; and
    bonding the nonlinear crystal above the grating outcoupler using Au—Au 100 metal thermo-compression bonding.

18. The method of claim 16:
    wherein the fundamental wavelength comprises wavelengths ranging from 440 nm to 480 nm; and
    wherein the ultra violet wavelengths comprise wavelengths ranging from 220 nm to 240 nm.

19. The method of claim 17 further comprising connecting a prism between the grating outcoupler and the front facet of the nonlinear crystal.

20. The method of claim 16 wherein the tapered gain medium further comprises:
    a GaN ridge gain medium coupled to the back cavity mirror and; and
    a GaN tapered gain medium coupled to the ridge gain medium and to the outcoupler grating.

21. The method of claim 20 wherein each tapered gain medium further comprises:
    a ridge electrode on the ridge gain medium; and
    a Gaussian electrode on the GaN tapered gain medium.

22. The method of claim 16 wherein the forming the outcoupler grating comprises:
   forming a curved grating outcoupler having a nonuniform grating duty cycle.

23. The method of claim 16 further comprising forming a mirror on the substrate below the curved grating outcoupler.

24. The method of claim 16 further comprising:
   frequency and phase locking each laser element to the master laser; and
   coherently combining ultra violet beamlets emitted from the exit facet by the laser elements.

25. A heterogeneously integrated chip-scale intra-cavity frequency doubled laser comprising:
   a substrate;
   a plurality of laser elements on the substrate, each laser element comprising a tapered semiconductor optical amplifier;
   a master laser diode on the substrate coupled to each laser element;
   wherein each laser element has a fundamental wavelength;
   wherein each laser element emits a beamlet;
   wherein each beamlet has a wavelength double the fundamental wavelength; and
   wherein each laser element is phase locked to the master laser diode.

26. The heterogeneously integrated chip-scale intra-cavity frequency doubled laser of claim 25:
   wherein the volume of the heterogeneously integrated chip-scale intra-cavity frequency doubled laser is less than 1 by 0.2 by 0.5 cm$^3$.

27. The heterogeneously integrated chip-scale intra-cavity frequency doubled laser of claim 25:
   wherein the integrated chip-scale intra-cavity frequency doubled laser has a frequency conversion efficiency of greater than 35% and has a wall-plug efficiency (WPE) greater than 10%.

28. The heterogeneously integrated chip-scale intra-cavity frequency doubled laser of claim 25 further comprising:
   a nonlinear crystal coupled to each laser element for second harmonic generation (SHG).

29. The heterogeneously integrated chip-scale intra-cavity frequency doubled laser of claim 28:
   wherein the nonlinear crystal comprises a front facet of the nonlinear crystal;
   wherein the front facet has a first coating that has anti-reflectivity (AR) to a fundamental wavelength of the laser element and high reflectivity (HR) to ultra violet wavelengths, and
   wherein an exit facet of the nonlinear crystal has a second coating that has HR to the fundamental wavelength of the laser element and AR to the ultra violet wavelengths.

30. The heterogeneously integrated chip-scale intra-cavity frequency doubled laser of claim 28 wherein each laser element further comprises:
   a curved detuned second-order grating outcoupler on the substrate having a nonuniform grating duty cycle coupled to the nonlinear crystal;
   wherein the curved detuned second-order grating outcoupler provides a well-collimated outcoupling of a fundamental wavelength of the laser element into the nonlinear crystal for frequency conversion; and
   wherein the efficiency of the well-collimated outcoupling is greater than 97%.

31. The heterogeneously integrated chip-scale intra-cavity frequency doubled laser of claim 25 wherein each tapered semiconductor optical amplifier (SOA) comprises a blue InGaN/GaN multiple quantum well (MQW) structure.

32. The heterogeneously integrated chip-scale intra-cavity frequency doubled laser of claim 30 wherein each tapered semiconductor optical amplifier (SOA) comprises a blue InGaN/GaN multiple quantum well (MQW) structure.

33. The heterogeneously integrated chip-scale intra-cavity frequency doubled laser of claim 30 wherein each laser element further comprises:
   an inverse tapered waveguide on the substrate coupled to the curved detuned second-order grating outcoupler;
   a photodetector coupled to the inverse tapered waveguide and to the master laser diode; and
   a phase modulator coupled to the master laser diode;
   wherein a small sample of the fundamental wavelength of each laser element is optically mixed with a sample of the master laser diode for phase detection and locking.

34. The heterogeneously integrated chip-scale intra-cavity frequency doubled laser of claim 25:
   wherein a fundamental wavelength of the master laser diode ranges from 440 nm to 480 nm; and
   wherein the each beamlet has a wavelength ranging from 220 nm to 240 nm.

35. The heterogeneously integrated chip-scale intra-cavity frequency doubled laser of claim 30 further comprising:
   a mirror on the substrate below the curved detuned second-order grating outcoupler, the mirror having high reflectivity.

36. The heterogeneously integrated chip-scale intra-cavity frequency doubled laser of claim 30 further comprising a prism coupled between the curved detuned second-order grating outcoupler and the front facet of the nonlinear crystal.

37. The heterogeneously integrated chip-scale intra-cavity frequency doubled laser of claim 25 further comprising:
   a combiner coupled to each beamlet for combining the beamlets.

38. The heterogeneously integrated chip-scale intra-cavity frequency doubled laser of claim 25 wherein the substrate comprises a nonpolar GaN substrate.

39. A method of fabricating a chip scale ultra violet laser source comprising:
   forming an InGaN/GaN MQW blue laser epi structure on a m-plane GaN substrate;
   defining a distributed Bragg reflector master laser in the epi; and
   forming a plurality of chip scale ultra violet laser elements on the substrate.

40. The method of claims 39 wherein forming each chip scale ultra violet laser element comprises:
   forming a tapered semiconductor optical amplifier (SOA), wherein the tapered semiconductor optical amplifier (SOA) comprises a blue InGaN/GaN multiple quantum well (MQW) structure;
   forming a curved detuned second-order grating outcoupler having a nonuniform grating duty cycle coupled to the tapered gain medium;
   forming a photodetector coupled to the outcoupler grating; and
   forming a phase modulator coupled to the photodetector.

41. The method of claims 40 wherein forming each chip scale ultra violet laser element further comprises:
   coupling a nonlinear crystal to the outcoupler at a front facet of the nonlinear crystal, wherein the front facet has a first coating that has anti-reflectivity (AR) to a fundamental wavelength of the laser element and high reflectivity (HR) to ultra violet wavelengths, and wherein an exit facet of the nonlinear crystal has a second coating that has HR to the fundamental wavelength of the laser element and AR to the ultra violet wavelengths.

42. The method of claim 41 further comprising:

using optical lithography and dry etching to form the tapered gain medium and the photodetector;

etching the epi layers to a GaN layer in a lower cladding region to provide a template for epitaxial re-growth;

depositing an oxide mask;

opening windows in the oxide mask for selective epi re-growth for the outcoupling grating, and gratings for the distributed Bragg reflector master laser and a back cavity distributed Bragg reflector (DBR);

regrowing epitaxial layers in the windows for the outcoupling grating, the distributed Bragg reflector master laser and the back cavity distributed Bragg reflector (DBR);

patterning and etching gratings for the outcoupling grating, the distributed Bragg reflector master laser and the back cavity distributed Bragg reflector (DBR);

removing the oxide mask;

forming electrodes and routing metal using optical lithography and metal lift-off;

forming tri-layer polymer waveguide structures for waveguides with low index polymer cladding layers, flouropolymers and a high index photo-sensitive core layer (PMMA);

forming the phase modulator by depositing a Ni/Cr heating element on a section of the tri-layer polymer waveguide structures; and depositing a backside metal electrode; and bonding the nonlinear crystal above the grating outcoupler using Au-Au 100 metal thermo-compression bonding.

43. The method of claim 42 further comprising connecting a prism between the grating outcoupler and the front facet of the nonlinear crystal.

\* \* \* \* \*